United States Patent [19]

(12) United States Patent
Cho

(10) Patent No.: US 7,564,397 B2
(45) Date of Patent: Jul. 21, 2009

(54) HIGH SLEW RATE AMPLIFIER, ANALOG-TO-DIGITAL CONVERTER USING SAME, CMOS IMAGER USING THE ANALOG-TO-DIGITAL CONVERTER AND RELATED METHODS

(75) Inventor: Taehee Cho, Irvine, CA (US)

(73) Assignee: Micron Technology, Inc., Boise, ID (US)

( * ) Notice: Subject to any disclaimer, the term of this patent is extended or adjusted under 35 U.S.C. 154(b) by 14 days.

(21) Appl. No.: 11/786,338

(22) Filed: Apr. 10, 2007

(65) Prior Publication Data

US 2008/0252379 A1    Oct. 16, 2008

(51) Int. Cl.
 *H03M 1/38*    (2006.01)
(52) U.S. Cl. ........................................ 341/161; 330/10
(58) Field of Classification Search ......... 341/155–165; 330/10, 207 A
 See application file for complete search history.

(56) References Cited

U.S. PATENT DOCUMENTS 6,294,954 B1 * 9/2001 Melanson .................... 330/10
7,116,255 B2 * 10/2006 Lee et al. .................... 341/144

\* cited by examiner

*Primary Examiner*—Lam T Mai
(74) *Attorney, Agent, or Firm*—Dorsey & Whitney LLP

(57) ABSTRACT

An amplifier, which may be used in a pipelined analog-to-digital converter, includes a first amplifier stage driving a second amplifier stage. At least one compensation capacitor is coupled to provide negative feedback through the capacitor from the second amplifier stage to the first amplifier stage. The slew rate of the amplifier is enhanced by substantially reducing the negative feedback coupled through the capacitor during a period following the transition of a signal applied to an input terminal of the amplifier. If the first stage of the amplifier has complementary signal nodes, the negative feedback coupled through the capacitor may be reduced, for example, by closing a switch coupled between first and second complementary nodes of the first amplifier stage.

53 Claims, 8 Drawing Sheets

HIGH SLEW RATE AMPLIFIER, ANALOG-TO-DIGITAL CONVERTER USING SAME, CMOS IMAGER USING THE ANALOG-TO-DIGITAL CONVERTER AND RELATED METHODS

TECHNICAL FIELD

Embodiments of this invention relate to amplifiers and analog-to-digital converters using such amplifiers.

BACKGROUND OF THE INVENTION

Operational amplifiers generally have complementary input terminals, a high input impedance, and a high gain, and they often have complementary output terminals. Such characteristics make operational amplifiers useful in a wide variety of applications. For example, operational amplifiers are frequently used in pipelined analog-to-digital ("A/D") converters, such as the A/D converter 10 shown in FIG. 1. The A/D converter 10 includes a series combination of number of A/D stages 12 connected in series with each other. Each of the A/D stages 12 includes a respective sample-and-hold ("S/H") circuit 14 having a sample output that is connected to the input of a processing stage 16. Each processing stage 16 generates a respective bit of a binary number corresponding to the amplitude of a signal applied to an input of the S/H circuit 14. As explained in greater detail below, each of the processing stages 16 includes an amplifier (not shown in FIG. 1) that alternates between sampling an input signal and amplifying it. In practice, the A/D stages 12 are driven by a clock signal (not shown) that periodically trigger the S/H circuit 14 in each stage 12. The clock signal also causes the amplifiers (not shown) in alternate stages 12 to sample while the amplifiers in the remaining stages amplify, and vice-versa. The bits generated by the respective processing stages 16 are applied to a digital error correction circuit 18 to generate a digital output signal indicative of the amplitude of an input signal $V_{IN}$ applied to the A/D converter 10. This digital output signal has the same number of bits as the number of bits from the processing stages 16.

As shown in FIG. 2, each of the processing stages 16 includes a single bit A/D converter 20, which generates a binary output. The output of the A/D converter 20 is also connected to the input of a digital-to-analog ("D/A") converter 24, which generates a respective analog voltage. A subtraction circuit 28 subtracts the analog signal from the D/A converter 24 from the analog signal at the output of the S/H circuit 12. The resulting signal is amplified by an operational amplifier 30 to provide the input to the next S/H circuit 12.

In operation, each of the A/D stages 12 corresponds to a different amplitude level. The A/D converter 20 in the first A/D stage 12 generates a "1" bit at its output if the $V_{IN}$ signal has an amplitude that is greater than a relatively large threshold voltage. For example, for an A/D converter 10 having an operating range from 0-8 volts, the A/D converter 20 in the first A/D stage 12 may generate a "1" bit if the amplitude of the $V_{IN}$ signal is greater than 4 volts. If the A/D converter 20 generates a "1" bit, the D/A converter 24 in the same stage generates an analog voltage corresponding to the threshold, e.g., 4 volts. Using the above example, if the amplitude of the signal $V_{IN}$ is 5.25 volts, the A/D converter 20 will generate a "1" bit, and the D/A converter 24 will output 4 volts. The subtraction circuit 28 will then output a voltage of 1.25 volts (i.e., 5.25 volts−4 volts), which is passed on to the next A/D stage 12 after being amplified by the amplifier 30.

The second A/D stage 12 determines whether the received voltage is greater than a respective threshold that is less than the threshold of the first stage 12, such as half the threshold of the first stage 12. Thus, again using the above example, the second A/D stage 12 may determine if the amplitude of the received signal is greater than 2 volts. In a similar manner, the subsequent A/D stages 12 determine if the received voltage is less than an ever-decreasing threshold level. However, since the amplifier 30 amplifies the signal from the subtraction circuit 28 in each of the stages, the subsequent stages 12 need not process an ever-decreasing input voltage. For example, if amplifier 30 in the first A/D stage 12 has a gain of 2, the second stage 12 can effectively determine if the signal at the output of the subtraction circuit 28 in the first stage 12 is greater than 2 volts by determining if the output of the amplifier 30 in the first stage 12 is greater than 4 volts. Since the 1.25 volt output of the subtraction circuit 28 in the first stage 12 amplified by the amplifier 30 will be 2.5 volts, which is less than 4 volts, the A/D converter 20 in the second stage 12 will output a "0" bit, and the subtraction circuit 28 in the second stage 12 will not subtract any value from the 2.5 volt input. By determining if twice the 1.25 volt amplitude of the signal from the subtraction circuit 28 in the first stage 12 is greater than 4 volts, the second A/D stage 12 effectively determines if the 5.25 volt amplitude of the input signal $V_{IN}$, less the 4 volt threshold value of the first stage 12 is greater than 2 volts. The amplifier 30 in the second stage 12 may also amplify the 2.5 volt output of the subtraction circuit 28 by 2 to output a voltage of 5 volts to the third A/D stage 12.

The third A/D stage 12 operates in the same manner as the first and second A/D stages 12 to compare the amplitude of the input signal to 4 volts. Since the received 5 volt signal is greater than 4 volts, the A/D converter 20 in the third A/D stage 12 outputs a "1" bit. However, in making this comparison, the third A/D stage 12 is effectively determining if the amplitude of the input signal $V_{IN}$, less the threshold value of any stage 12 generating a "1" bit, is greater than 1 volt. The advantage of using processing stages 16 having an amplifier 30 is that the same circuit can be used for each of the processing stages 16, yet the downstream A/D stages 12 can process successively smaller voltage levels without any loss of resolution or accuracy.

As mentioned above, and as explained in greater detail below, the amplifier 30 receives a clock signal (not shown in FIG. 2) that alternates between sampling a signal applied to its input and then amplifying the sample.

The A/D converter 10 shown in FIGS. 1 and 2 can generate very precise indications of the magnitude of an analog signal by including a large number of A/D stages 12 since a large number of A/D stages 12 generate a correspondingly large number of bits. However, it can take considerable time for an input signal to propagate through all of the A/D stages 12 as the number of stages becomes larger. It is therefore important for the operational amplifiers 30 in the stages 12 to respond as quickly as possible to changes in voltage level. Unfortunately, the slew rates of common operational amplifier designs can be fairly slow, thus reducing the speed of A/D converters and other types of devices using such amplifiers.

An example of a typical operational amplifier 40 of conventional design is shown in FIG. 3. The operational amplifier 40 includes a first stage 42 implemented by the components in the center of the amplifier 40, and a second stage 44 implemented by the components on each side of the amplifier 40. The first stage 42 includes a pair of NMOS input transistors 50, 52 that receive respective input signals In+ and In− at their gates. The transistors 50, 52 are each coupled in series with respective sets of PMOS bias transistors 56, 58 and NMOS bias transistors 60, 62. Appropriate bias voltages are applied to the gates of these transistors 56, 58, 60, 62 so that they have a desired impedance and allow a desired level of current to flow between a supply voltage $V_{CC}$ and ground. The sources of the input transistors 50, 52 are coupled to each other so that they form a virtual ground with respect to the input signals In+ and In−. The outputs of the first stage 42 are a− and a+ at the respective junctions between the PMOS bias transistors 58 and the NMOS bias transistors 60.

In operation, the input transistors 50, 52 invert the respective signals In+ and In− applied to their gates so that a change in the voltage at node b− is inversely proportional to a change in the voltage of the input signal In+, and a change in the voltage at node b+ is inversely proportional to a change in the voltage of the input signal In−. For example, an increase in In+ and a corresponding decrease in In− cause an increase in current through the transistor 50 and a decrease in current through the transistor 52. The increased current flowing through the transistors 56, 58 on the left hand side of the first stage 42 causes the voltage at the a− output to decrease, and the decreased current flowing through the transistors 56, 58 on the right hand side of the first stage 42 causes the voltage at the a+ output to increase.

The outputs a− and a+are coupled to respective NMOS input transistors 70, 72 of the second stage 44. The transistors 70, 72 are each coupled in series with respective PMOS bias transistors 76 and respective NMOS bias transistors 78, which receive appropriate bias voltages at their gates to provide a desired impedance and allow a desired level of current to flow through the transistors 70, 72. Like the drains of the bias transistors 62, the drains of the bias transistors 72 are coupled to each other so that they form a virtual ground with respect to the input signals applied to the second stage 44.

In operation, a decrease in the a− signal responsive to an increase in In+ signal causes a decrease in the current flowing through the transistor 70. Similarly, an increase in the a+ signal responsive to a decrease in In− signal causes an increase in the current flowing through the transistor 72. The decreased current through the transistor 76 on the left hand side of the second stage 44 causes the voltage at the OUT+ output terminal to increase, and the increased current through the transistor 76 on the right hand side of the second stage 44 causes the voltage at the OUT− output terminal to decrease.

In practice, operational amplifiers like the amplifier 40 shown in FIG. 3 can be unstable and are therefore subject to oscillation. As a result, a compensation capacitor 80 is normally connected between the output terminal OUT+ and a node b−, and another compensation capacitor 82 is normally connected between the output terminal OUT− and a node b+. As explained above, the voltage at node b− is inversely proportional to In+, and the voltage at node b+ is inversely proportional to the input signal In−. Insofar as the voltage at the output terminal OUT+ is directly proportional to In+, the voltage at the output terminal OUT+ is inversely proportional to the voltage at node b−. Similarly, since the voltage at the output terminal OUT− is directly proportional to In−, the voltage at the output terminal OUT− is inversely proportional to the voltage at node b+. Therefore, the compensation capacitors 80, 82 provide negative feedback from the output of the second stage 44 to respective nodes b− and b+ of the first stage 42. This negative feedback stabilizes the amplifier 40 and keeps it from oscillating.

Although the use of the compensation capacitors 80, 82 has the desirable effect of stabilizing the amplifier 40, it also has the undesirable effect of reducing the slew rate of the amplifier 40. The compensation capacitors 80, 82 reduce the slew rate of the amplifier 40 because they provide very large negative feedback signals to the first stage 42 of the amplifier as the output terminals OUT+ and OUT− start to transition. As shown in FIG. 4, the OUT+ terminal starts to transition high at time $t_0$ responsive to the input signal In+ transitioning high and the input signal In− transitioning low. However, a short time later, the very large negative feedback signals coupled through the compensation capacitors 80, 82 actually cause the transition of the OUT+ signal to reverse direction and transition negatively until time $t_1$. Thereafter, as the capacitors 80, 82 become charged, the transition of the OUT+ resumes its positive direction. However, the OUT+ signal does not reach the high logic level until time $t_2$, which is substantially after it would reach that level but for the period of negative transition prior to time $t_1$. When the amplifier 40 is used in a pipelined A/D converter, such as the A/D converter 10, the reduced slew rate caused by the compensation capacitors 80, 82 can significantly increase the time required for the A/D converter to provide an output indicative of the magnitude of an analog signal.

There is therefore a need for an amplifier that has an enhanced slew rate so that it can be advantageously used in a variety of applications, including being used in pipelined A/D converters.

DETAILED DESCRIPTION OF THE INVENTION

Figure 5:
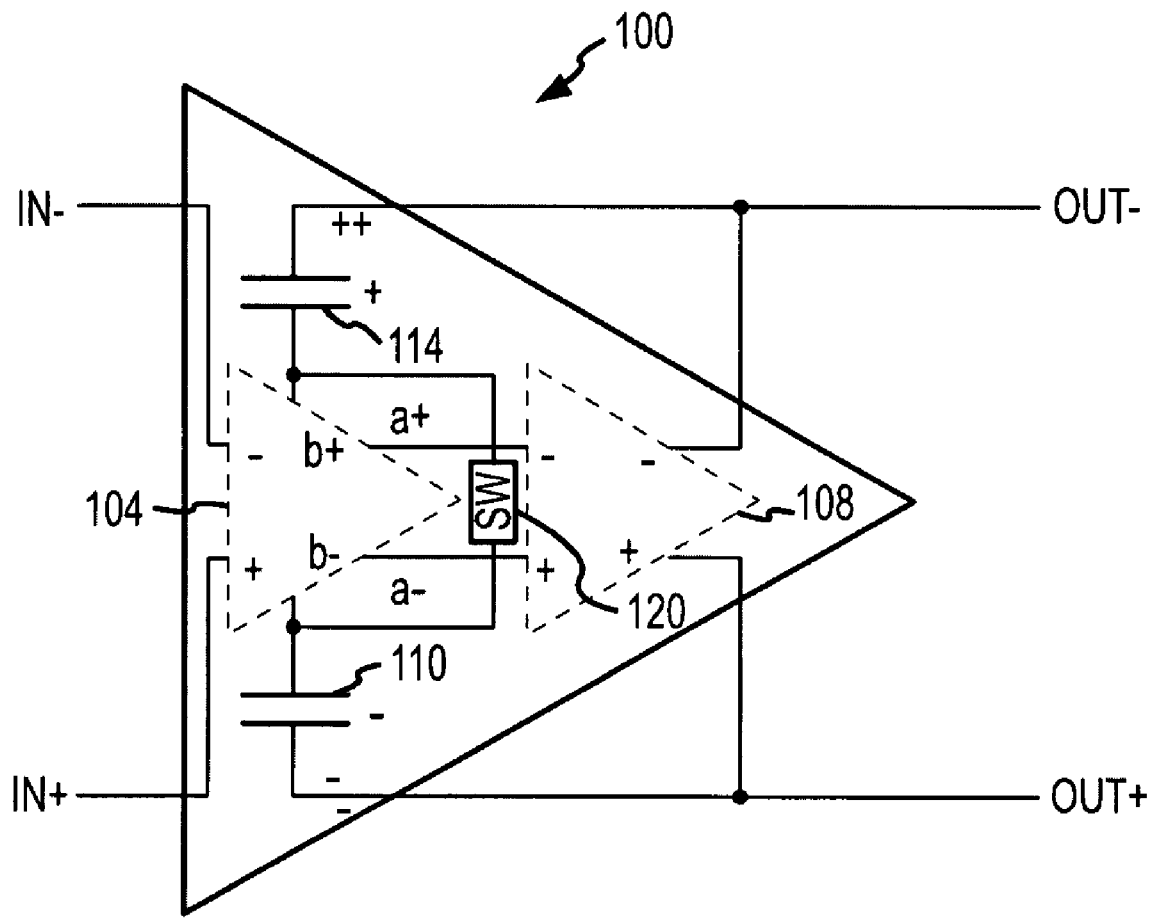
FIG. 5 is a block diagram of an amplifier according to an embodiment of the invention, which may be used in the analog-to-digital converter of FIG. 1.

An operational amplifier 100 according to an embodiment of the invention is shown in FIG. 5. The amplifier 100 includes a first stage 104 having a pair of differential or complementary input terminals In+ and In−. The first stage 104 also has a pair of complementary nodes b− and b+that are driven inversely by signals applied to the In+ and In− terminals, respectively. Finally, the first stage 104 of the amplifier 100 has a pair of complementary output terminals a− and a+, which are also driven inversely by signals applied to the In+ and In− terminals, respectively.

The operational amplifier 100 also includes a second stage 108 that has a pair of complementary input terminals + and − that are connected to the respective output terminals a− and a+ of the first stage 104. The second stage 108 also has a pair of complementary output terminals OUT+ and OUT−, which are driven inversely by the signals on the output terminals on the output terminals a− and a+ from the first stage 104.

Figure 3:
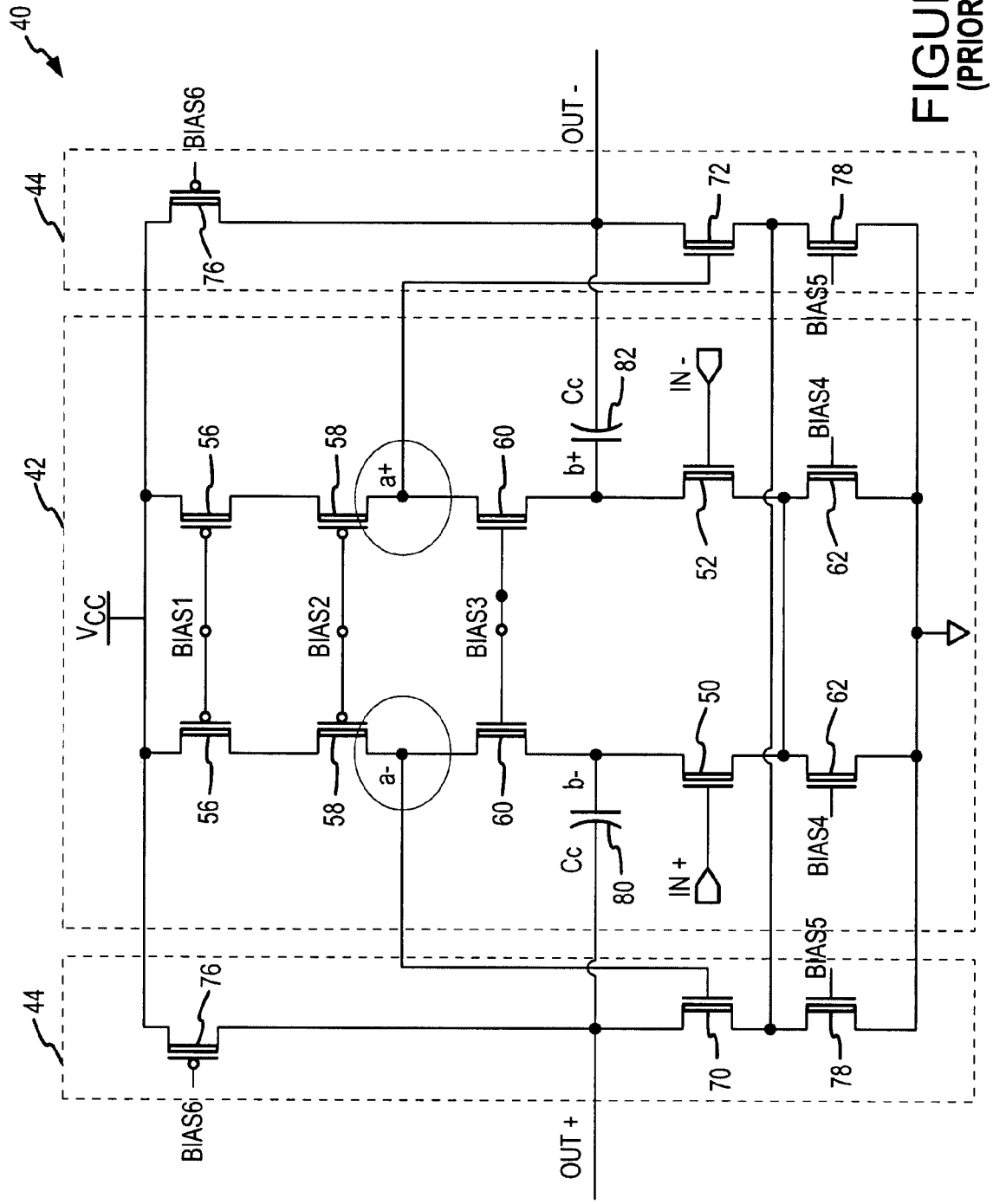
FIG. 3 is a schematic diagram of a prior art operational amplifier circuit that may be used in the analog-to-digital converter of FIG. 1.
Figure 4:
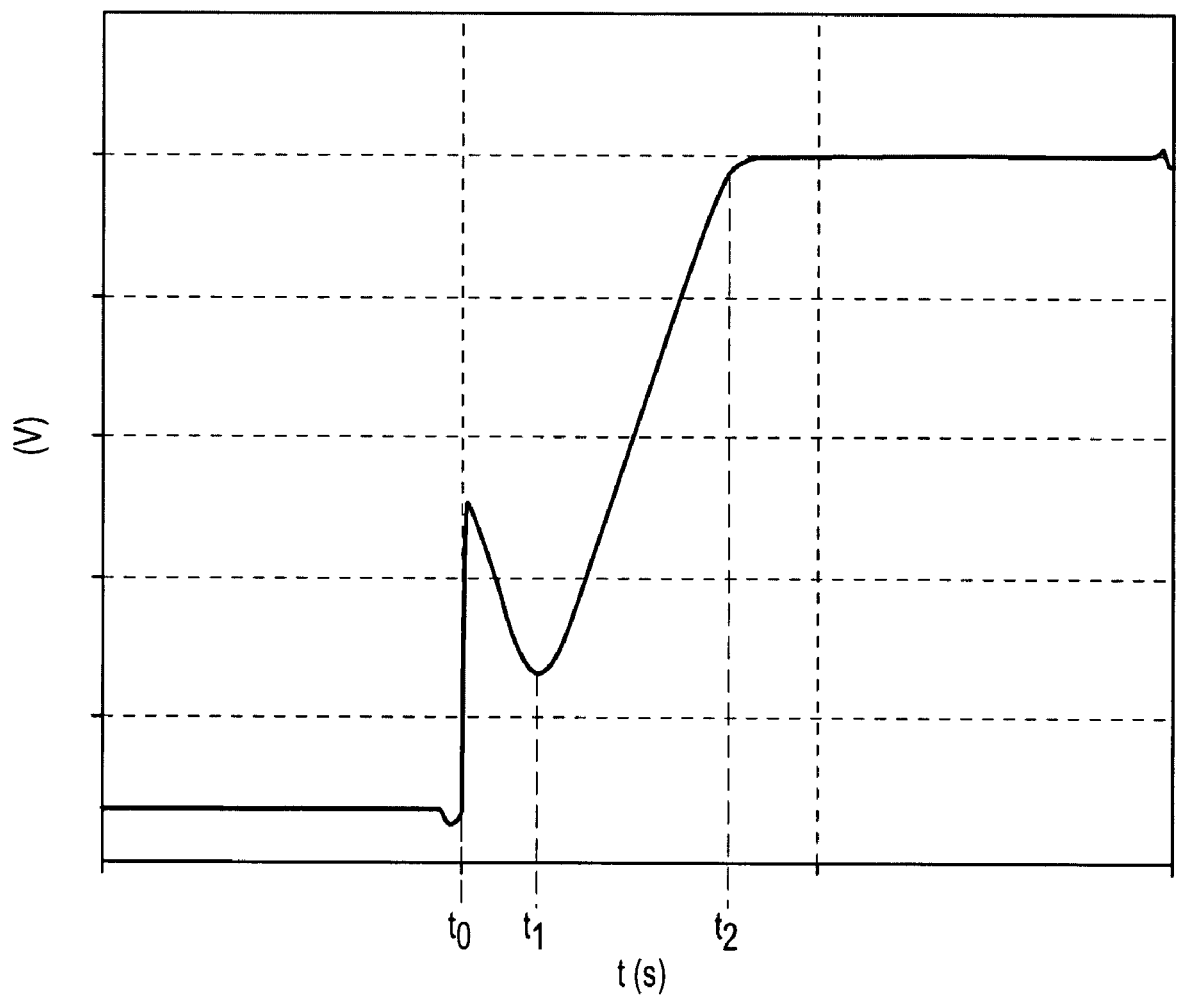
FIG. 4 is a waveform diagram showing an output signal generated by the operational amplifier of FIG. 3.

To stabilize the amplifier 100, a compensating capacitor 110 is connected between the OUT+ terminal of the second stage 108 and the b− node of the first stage 104. Similarly, another compensating capacitor 114 is connected between the OUT− terminal of the second stage 108 and the b+ node of the first stage 104. The compensating capacitors 110, 114 therefore provide negative feedback as explained above with reference to the amplifier 40 shown in FIG. 3. However, as also explained above, the capacitors 110, 114 would also reduce the slew rate of the amplifier 100. To prevent the capacitors 110, 114 from degrading the slew rate performance of the amplifier 100, a switch 120 is provided to couple the b+ and b− nodes to each other during a short period after the start of each amplifying period of the amplifier. Insofar as the voltage on the b+ and b− nodes change in opposite directions, the switch 120 effectively makes the b+ and b− nodes virtual grounds, and thereby substantially reduces or eliminates the negative feedback coupled through the capacitors 110, 112 during the initial portion of each amplification. The switch 120 is closed responsive to a clock signal (not shown in FIG. 5) during the initial portion of a period during which the amplifier 100 amplifies rather than samples the input signal.

Figure 1:
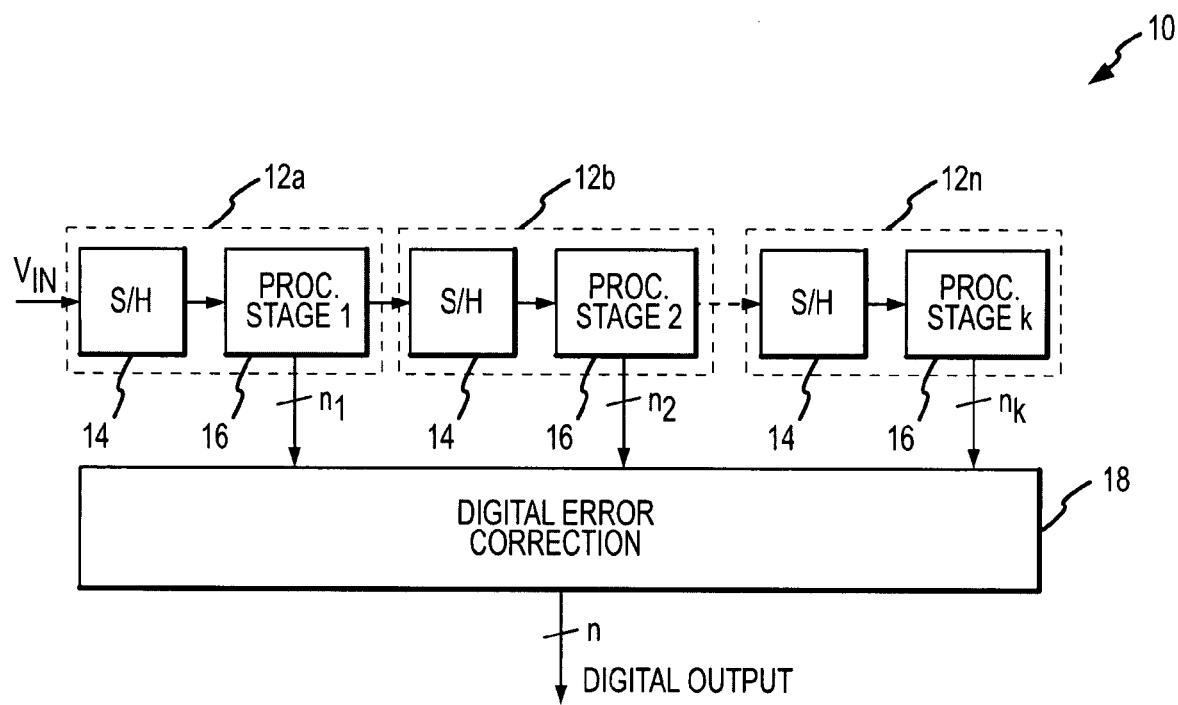
FIG. 1 is a block diagram of a prior art pipelined analog-to-digital converter having a plurality of stages generating respective output bits.
Figure 2:
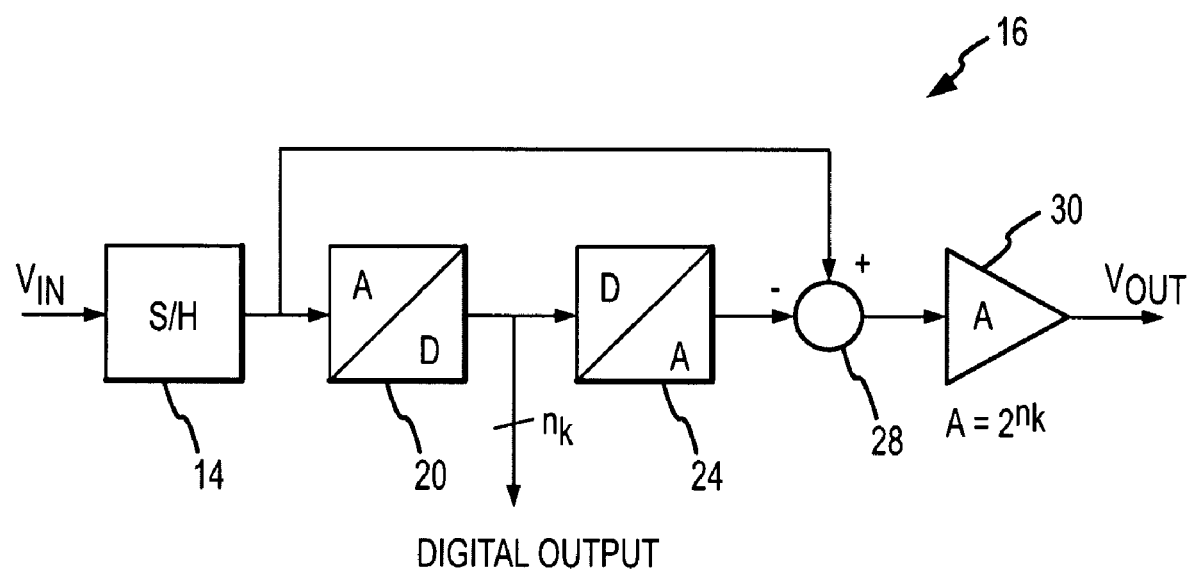
FIG. 2, is a block diagram of a prior art analog-to-digital converter processing stage that may be used in the analog-to-digital converter of FIG. 1.
Figure 6:
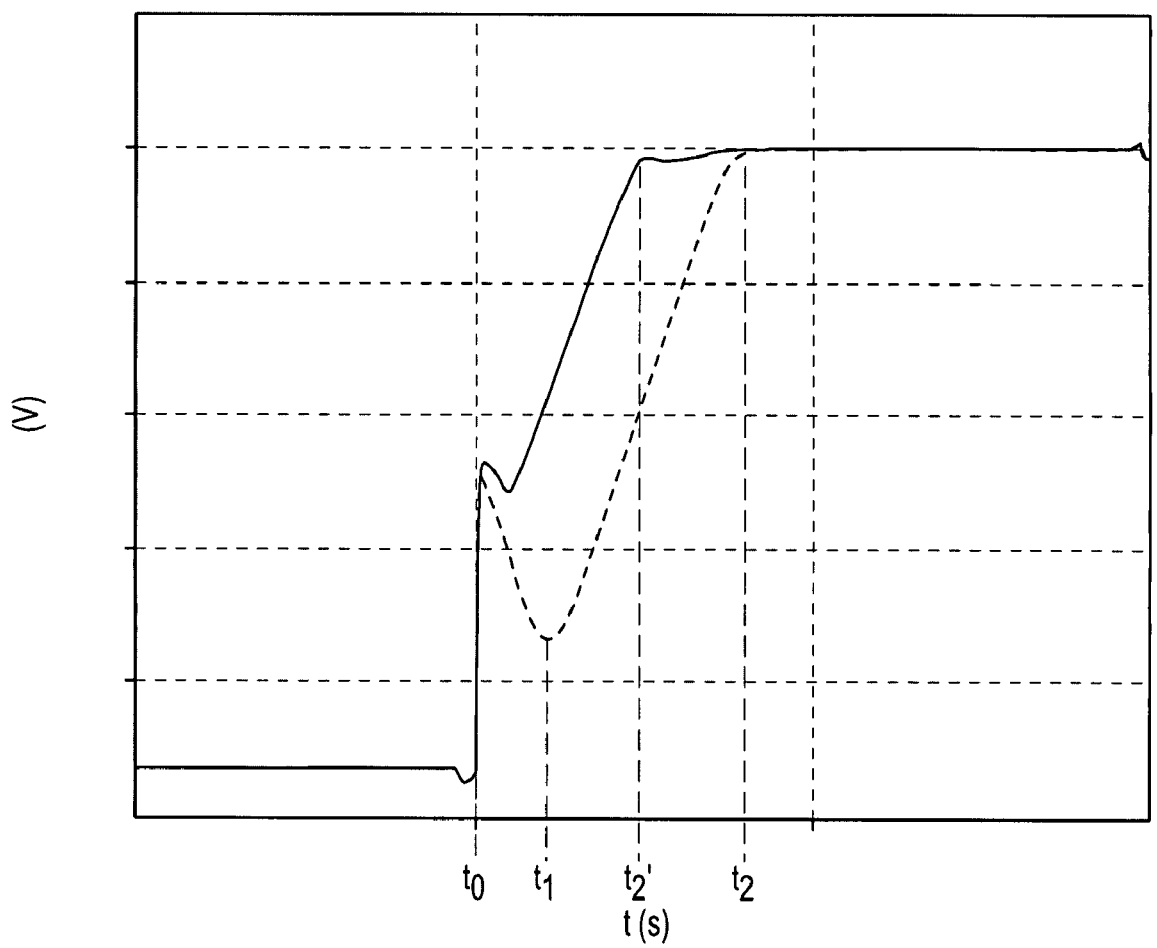
FIG. 6 is a waveform diagram showing an output signal generated by the operational amplifier of FIG. 5 in comparison to the output signal generated by the operational amplifier of FIG. 3.

As shown in solid line in FIG. 6, the transition of the OUT+ terminal in the direction opposite to which it is driven by complementary transitions of the In+ and In− signals is greatly reduced. As a result, the OUT+ signal reaches the high logic level at time $t_2'$, which is significantly sooner than the time $t_2$ that the OUT+ signals from the amplifier 40 reaches the high logic level, as shown in dotted line in FIG. 6. The enhanced slew rate of the amplifier 100 makes it ideally suited for use where a high slew rate is desired, such as in the A/D converter 10 of FIG. 1.

Figure 7:
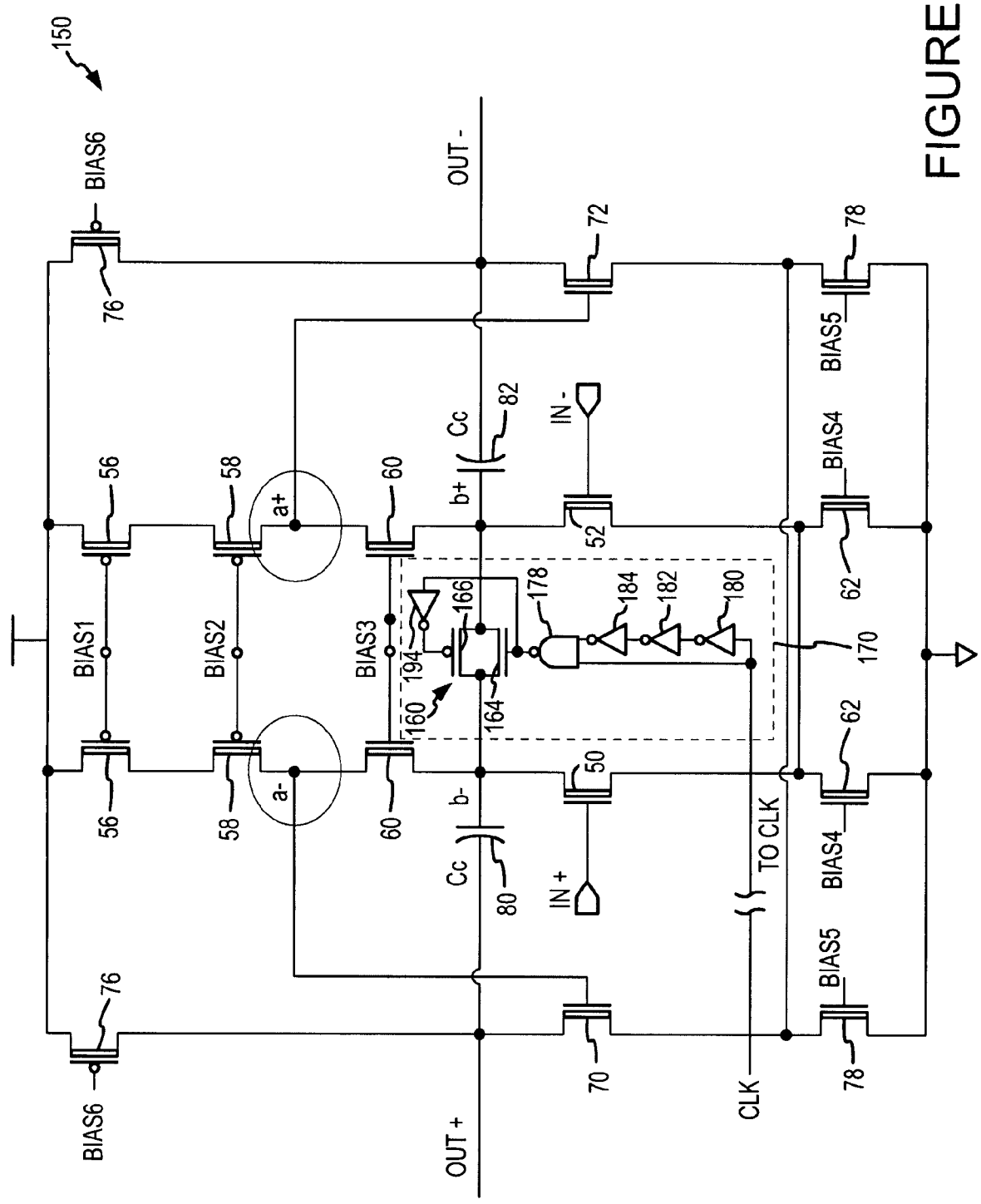
FIG. 7 is a schematic diagram of an operational amplifier according to an embodiment of the invention, which may be used in the analog-to-digital converter of FIG. 1.

Another embodiment of an operational amplifier 150 according to the invention is shown in FIG. 7. The amplifier 150 uses many of the same components that are used in the operational amplifier 40 of FIG. 3, and they operate in substantially the same manner. Therefore, in the interests of brevity and clarity, the components that are common to both amplifiers 40, 150 have been provided with the same reference numerals, and an explanation of their structure and operation will not be repeated. The amplifier 150 differs from the amplifier 40 of FIG. 3 by including a switch 160, which may be implemented by a pass gate formed by an NMOS transistor 164 having its source and drain connected in parallel with a source and drain of a PMOS transistor 166. The gates of the transistors 164, 166 are connected to a pulse generator circuit 170 that turns the transistors 164, 166 ON for a short period after each transition of the In+ and/or In− signals. For example the pulse generator circuit 170 may include an AND gate 178 that receives a clock signal CLK. The CLK signal is also coupled through a series of inverters 180, 182, 184 to another input of the AND gate 178. The output of the inverter 184 is normally high when the CLK signal is low, thereby enabling the AND gate 178. Therefore, when the CLK signal transitions high, the output of the AND gate 178 also transitions high. The output of the AND gate 178 remains high until the rising edge of the CLK signal has propagated through the inverters 180-184 to drive the output of the inverter 184 low. The output of the AND gate 178 therefore outputs a high pulse responsive to each rising edge of the CLK signal. This high pulse at the output of the AND gate 178 turns ON the NMOS transistor 164, and it is applied to an inverter 194, which responds by outputting a short low pulse to turn ON the PMOS transistor 166. The switch 160 is therefore closed for a short period at the start of each amplifying period of the amplifier 150.

Figure 8:
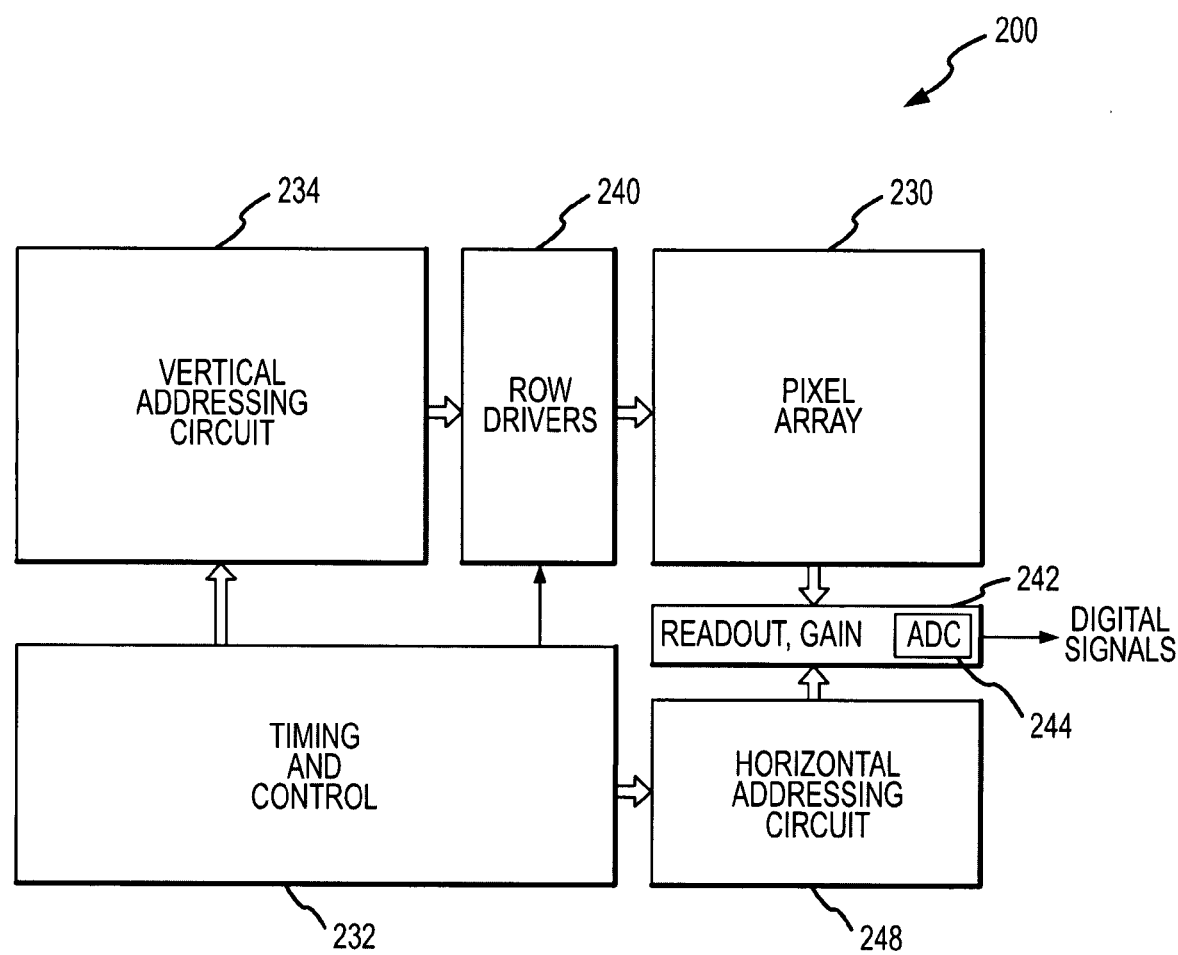
FIG. 8 is a block diagram of a CMOS imaging device using an analog-to-digital converter containing an operational amplifier as shown in FIG. 5 or 7 or an operational amplifier according to some other embodiment of the invention.

FIG. 8 shows an exemplary CMOS active pixel sensor integrated circuit chip 200 that is used with an analog-to-digital converter containing an operational amplifier 100, 150 as shown in FIG. 5 or 7, respectively. The sensor 200 may alternatively use an operational amplifier according to some other embodiment of the invention. The sensor 200 includes an array of active pixel sensors 230 and a controller 232, which provides timing and control signals to enable reading out of signals stored in the pixels. Exemplary arrays may have dimensions of 128 by 128 pixels or 256 by 256 pixels, although, in general, the size of the array 230 will depend on the particular implementation. The imager 200 is read out a row at a time using a parallel column readout architecture. The controller 232 selects a particular row of pixels in the array 230 by controlling the operation of a vertical addressing circuit 234 and row drivers 240. Signals stored in the selected row of pixels are read out to circuitry 242 for amplifying the pixel signals and for converting the analog signals to corresponding digital signals using an analog-to-digital converter 244. The analog-to-digital converter 244 may include operational amplifiers 100, 150 as shown in FIG. 5 or 7, respectively, or operational amplifiers according to some other embodiment of the invention. Signals for selecting the digital signals corresponding to a particular column in the array are provided from the controller 232 through a horizontal addressing circuit 248.

From the foregoing it will be appreciated that, although specific embodiments of the invention have been described herein for purposes of illustration, it will be understood by one skilled in the art that various modifications may be made without deviating from the invention. For example, although the embodiments of the invention have been described in the context of an operational amplifier having complementary inputs and outputs, it will be understood that other embodiments may be amplifiers having single-ended inputs and/or outputs. Accordingly, the invention is not limited except as by the appended claims.

What is claimed is:

1. An amplifier, comprising:
   a first amplifier stage having an input terminal and an output terminal;
   a second amplifier stage having an input terminal and an output terminal, the input terminal being coupled to the output terminal of the first amplifier stage;
   a compensation capacitor coupled to provide negative feedback through the capacitor from the second amplifier stage to the first amplifier stage; and
   a switch circuit coupled to one of the first and second amplifier stages to substantially reduce the negative feedback coupled through the compensation capacitor during an initial portion of an amplifying period of the amplifier.

2. The amplifier of claim 1 wherein the switch circuit is coupled between complementary nodes of one of the first and second amplifier stages.

3. The amplifier of claim 2 wherein the switch circuit is coupled between complementary nodes of the first amplifier stage.

4. The amplifier of claim 1 wherein the second amplifier stage includes first and second complementary input terminals and first and second complementary output terminals, wherein the first amplifier stage each include first and second complementary input terminals and first and second complementary output terminals coupled to the first and second input terminals of the second amplifier stage, and wherein the amplifier further comprises:
- a first compensating capacitor connected between the first output terminal of the second amplifier stage and a first node in the first amplifier stage on which a signal varies inversely with a signal output from the first output terminal; and
- a second compensating capacitor connected between the second output terminal of the second amplifier stage and a second node in the first amplifier stage on which a signal varies inversely with a signal output from the first output terminal.

5. The amplifier of claim 1 wherein the switch circuit comprises a switch connected between the first and second nodes in the first amplifier stage.

6. The amplifier of claim 1 wherein the switch circuit comprises:
- an electrically operated switch that is closed responsive to an activation signal applied to an input terminal of the electrically operated switch; and
- a pulse generator having an input terminal coupled to receive a clock signal, and having an output terminal coupled to the input terminal of the electrically operated switch, the pulse generator being configured to generate the activation signal for a predetermined period responsive to each transition of the clock signal.

7. An operational amplifier, comprising:
- a first operational amplifier stage having a first differential input stage, the first differential input stage having first and second complementary input terminals, first and second complementary output terminals, and first and second complementary nodes intermediate the first and second input terminals and the first and second output terminals;
- a second operational amplifier stage having first and second complementary input terminals coupled to the first and second complementary output terminals of the first operational amplifier stage, the second operation amplifier stage further having first and second complementary output terminals;
- a first compensating capacitor coupled between the first complementary output terminal of the second operational amplifier stage and the first complementary node of the first operational amplifier stage;
- a second compensating capacitor coupled between the second complementary output terminal of the second operational amplifier stage and the second complementary node of the first operational amplifier stage; and
- a switch coupled between the first and second complementary nodes of the first operational amplifier stage, the switch being configured to couple the first and second complementary nodes to each other during an initial portion of an amplifying period of the operational amplifier.

8. The operational amplifier of claim 7 wherein the switch comprises:
- an electrically operated switch device that is closed responsive to an activation signal applied to an input terminal of the electrically operated switch device; and
- a pulse generator having an input terminal coupled to receive a clock signal, and having an output terminal coupled to the input terminal of the electrically operated switch device, the pulse generator being configured to generate the activation signal for a predetermined period responsive to each transition of the clock signal.

9. The operational amplifier of claim 7 wherein the first operational amplifier stage comprises:
- a pair of first transistors forming the first differential input stage, the first transistors having respective gates coupled to the first and second input terminals, respectively, of the first operational amplifier stage;
- a pair of second transistors connected in series with respective first transistors, the second transistors having respective gates coupled to receive a first bias voltage; and
- a pair of third transistors connected in series with respective second transistors, the third transistors having respective gates coupled to receive a second bias voltage, the first output terminal of the first operational amplifier stage being coupled to a first junction between one of the second transistors and one of the third transistors and the second output terminal of the first operational amplifier stage being coupled to a second junction between the other of the second transistors and the other of the third transistors.

10. The operational amplifier of claim 9 wherein the first complementary node is formed by an interconnection between one of the first transistors and one of the second transistors, and the second complementary node is formed by an interconnection between the other of the first transistors and the other of the second transistors.

11. The operational amplifier of claim 9 wherein the second operational amplifier stage comprises:
- a first output transistor having a gate coupled to the first output terminal of the first operational amplifier stage;
- a second output transistor having a gate coupled to the second output terminal of the first operational amplifier stage;
- a fourth transistor coupled in series with the first output transistor, the first output terminal of the second operational amplifier stage being formed between the first output transistor and the fourth transistor; and
- a fifth transistor coupled in series with the second output transistor, the second output terminal of the second operational amplifier stage being formed between the second output transistor and the fifth transistor.

12. An analog-to-digital converter, comprising a plurality of series coupled analog-to-digital converter stages each of which has an analog output terminal, an analog input terminal, and a digital output terminal, each of the analog-to-digital converter stages comprising:
- a sample and hold circuit having an input coupled to the input terminal of the analog-to-digital converter stage;
- a single bit analog-to-digital converter having an input terminal coupled to receive a signal sample from the sample and hold circuit, the single bit analog-to-digital converter having an output terminal coupled to the digital output terminal of the analog-to-digital converter stage;
- a digital-to-analog converter having an input terminal coupled to the output terminal of the single bit analog-to-digital converter;
- a summing circuit having a first input terminal of one polarity coupled to receive the signal sample from the sample and hold circuit and a second input terminal of a polarity opposite the polarity of the first input terminal coupled to an output terminal of the digital-to-analog converter;
- an amplifier having an input terminal coupled to an output terminal of the summing circuit and an output terminal coupled to the analog output terminal of the analog-to-digital converter stage, the amplifier comprising:

a first amplifier stage having an input terminal coupled to the input terminal of the amplifier, the first amplifier stage further having an output terminal;

a second amplifier stage having an input terminal coupled to the output terminal of the first amplifier stage, the second amplifier stage further having an output terminal coupled to the output terminal of the amplifier;

a compensation capacitor coupled to provide negative feedback through the capacitor from the second amplifier stage to the first amplifier stage; and a switch circuit coupled to one of the first and second amplifier stages to substantially attenuate the negative feedback coupled through the compensation capacitor during an initial portion of an amplifying period of the amplifier.

13. The analog-to-digital converter of claim 12 wherein the switch circuit is coupled between complementary nodes of one of the first and second amplifier stages.

14. The analog-to-digital converter of claim 13 wherein the switch circuit is coupled between complementary nodes of the first amplifier stage.

15. The analog-to-digital converter of claim 12 wherein the second amplifier stage includes first and second complementary input terminals and first and second complementary output terminals, wherein the first amplifier stage each include first and second complementary input terminals and first and second complementary output terminals coupled to the first and second input terminals of the second amplifier stage, and wherein the amplifier further comprises:

a first compensating capacitor connected between the first output terminal of the second amplifier stage and a first node in the first amplifier stage on which a signal varies inversely with a signal output from the first output terminal; and a second compensating capacitor connected between the second output terminal of the second amplifier stage and a second node in the first amplifier stage on which a signal varies inversely with a signal output from the first output terminal.

16. The analog-to-digital converter of claim 12 wherein the switch circuit comprises a switch connected between the first and second nodes in the first amplifier stage.

17. The analog-to-digital converter of claim 12 wherein the switch circuit comprises:

an electrically operated switch that is closed responsive to an activation signal applied to an input terminal of the electrically operated switch; and a pulse generator having an input terminal coupled to receive a clock signal, and having an output terminal coupled to the input terminal of the electrically operated switch, the pulse generator being configured to generate the activation signal for a predetermined period responsive to each transition of the clock signal.

18. An analog-to-digital converter, comprising a plurality of series coupled analog-to-digital converter stages each of which has a pair of complementary analog input terminals, a pair of complementary analog output terminals, and a digital output terminal, each of the analog-to-digital converter stages comprising:

a sample and hold circuit having a pair of complementary input terminals coupled to respective ones of the complementary analog input terminals of the analog-to-digital converter stage;

a single bit analog-to-digital converter having a pair of complementary input terminals coupled to receive a differential signal sample from the sample and hold circuit, the single bit analog-to-digital converter having an output terminal coupled to the digital output terminal of the analog-to-digital converter stage;

a digital-to-analog converter having an input terminal coupled to the output terminal of the single bit analog-to-digital converter;

a summing circuit having complementary first input terminals of one polarity coupled to receive the differential signal sample from the sample and hold circuit and complementary second input terminals of a polarity opposite the polarity of the first input terminals coupled to the complementary output terminals of the digital-to-analog converter;

an operational amplifier having a pair of complementary input terminals coupled to complementary output terminals of the summing circuit and complementary output terminals coupled to the analog output terminals of the analog-to-digital converter stage, the operation amplifier comprising:

a first operational amplifier stage having a first differential input stage, the first differential input stage having first and second complementary input terminals, first and second complementary output terminals, and first and second complementary nodes intermediate the first and second input terminals and the first and second output terminals;

a second operational amplifier stage having first and second complementary input terminals coupled to the first and second complementary output terminals of the first operational amplifier stage, the second operation amplifier stage further having first and second complementary output terminals;

a first compensating capacitor coupled between the first complementary output terminal of the second operational amplifier stage and the first complementary node of the first operational amplifier stage;

a second compensating capacitor coupled between the second complementary output terminal of the second operational amplifier stage and the second complementary node of the first operational amplifier stage; and a switch coupled between the first and second complementary nodes of the first operational amplifier stage, the switch being configured to couple the first and second complementary nodes to each other during an initial portion of an amplifying period of the operational amplifier.

19. The analog-to-digital converter of claim 18 wherein the switch comprises:

an electrically operated switch device that is closed responsive to an activation signal applied to an input terminal of the electrically operated switch device; and a pulse generator having an input terminal coupled to receive a clock signal, and having an output terminal coupled to the input terminal of the electrically operated switch, the pulse generator being configured to generate the activation signal for a predetermined period responsive to each transition of the clock signal.

20. The analog-to-digital converter of claim 18 wherein the first operational amplifier stage comprises:

a pair of first transistors forming the first differential input stage, the first transistors having respective gates coupled to the first and second input terminals, respectively, of the first operational amplifier stage;

a pair of second transistors connected in series with respective first transistors, the second transistors having respective gates coupled to receive a first bias voltage; and a pair of third transistors connected in series with respective second transistors, the third transistors having respective gates coupled to receive a second bias voltage, the first output terminal of the first operational amplifier stage being coupled to a first junction between one of the second transistors and one of the third transistors, and the second output terminal of the first operational amplifier stage being coupled to a second junction between the other of the second transistors and the other of the third transistors.

21. The analog-to-digital converter of claim 20 wherein the first complementary node is formed by an interconnection between one of the first transistors and one of the second transistors, and the second complementary node is formed by an interconnection between the other of the first transistors and the other of the second transistors.

22. The analog-to-digital converter of claim 20 wherein the second operational amplifier stage comprises:
   a first output transistor having a gate coupled to the first output terminal of the first operational amplifier stage;
   a second output transistor having a gate coupled to the second output terminal of the first operational amplifier stage;
   a fourth transistor coupled in series with the first output transistor, the first output terminal of the second operational amplifier stage being formed between the first output transistor and the fourth transistor; and
   a fifth transistor coupled in series with the second output transistor, the second output terminal of the second operational amplifier stage being formed between the second output transistor and the fifth transistor.

23. An imaging device, comprising:
   an array of imaging elements arranged in rows and columns, each of the imaging elements being operable to output an analog signal indicative of a respective image pixel;
   an addressing circuit coupled to the array of imaging elements, the addressing circuit being operable to cause the analog signals from the respective imaging elements to be sequentially output from array; and
   an analog-to-digital converter coupled to receive the analog signals from the array of imaging elements, the analog-to-digital converter comprising a plurality of series coupled analog-to-digital converter stages each of which has an analog input terminal, an analog output terminal, and a digital output terminal, the analog input terminal a first of the analog-to-digital converter stages being coupled to receive the analog signals from the array of imaging elements, each of the analog-to-digital converter stages comprising:
   a sample and hold circuit having an input coupled to the input terminal of the analog-to-digital converter stage;
   a single bit analog-to-digital converter having an input terminal coupled to receive a signal sample from the sample and hold circuit, the single bit analog-to-digital converter having an output terminal coupled to the digital output terminal of the analog-to-digital converter stage;
   a digital-to-analog converter having an input terminal coupled to the output terminal of the single bit analog-to-digital converter;
   a summing circuit having a first input terminal of one polarity coupled to receive the signal sample from the sample and hold circuit and a second input terminal of a polarity opposite the polarity of the first input terminal coupled to an output terminal of the digital-to-analog converter;
   an amplifier having an input terminal coupled to an output terminal of the summing circuit and an output terminal coupled to the analog output terminal of the analog-to-digital converter stage, the amplifier comprising:
   a first amplifier stage having an input terminal coupled to the input terminal of the amplifier, the first amplifier stage further having an output terminal;
   a second amplifier stage having an input terminal coupled to the output terminal of the first amplifier stage, the second amplifier stage further having an output terminal coupled to the output terminal of the amplifier;
   a compensation capacitor coupled to provide negative feedback through the capacitor from the second amplifier stage to the first amplifier stage; and
   a switch circuit coupled to one of the first and second amplifier stages to substantially attenuate the negative feedback coupled through the compensation capacitor during an initial portion of an amplifying period of the amplifier.

24. The imaging device of claim 23 wherein the switch circuit is coupled between complementary nodes of one of the first and second amplifier stages.

25. The imaging device of claim 24 wherein the switch circuit is coupled between complementary nodes of the first amplifier stage.

26. The imaging device of claim 23 wherein the second amplifier stage includes first and second complementary input terminals and first and second complementary output terminals, wherein the first amplifier stage each include first and second complementary input terminals and first and second complementary output terminals coupled to the first and second input terminals of the second amplifier stage, and wherein the amplifier further comprises:
   a first compensating capacitor connected between the first output terminal of the second amplifier stage and a first node in the first amplifier stage on which a signal varies inversely with a signal output from the first output terminal; and
   a second compensating capacitor connected between the second output terminal of the second amplifier stage and a second node in the first amplifier stage on which a signal varies inversely with a signal output from the first output terminal.

27. The imaging device of claim 23 wherein the switch circuit comprises a switch connected between the first and second nodes in the first amplifier stage.

28. The imaging device of claim 23 wherein the switch circuit comprises:
   an electrically operated switch that is closed responsive to an activation signal applied to an input terminal of the electrically operated switch; and
   a pulse generator having an input terminal coupled to receive a clock signal, and having an output terminal coupled to the input terminal of the electrically operated switch, the pulse generator being configured to generate the activation signal for a predetermined period responsive to each transition of the clock signal.

29. An imaging device, comprising:
   an array of imaging elements arranged in rows and columns, each of the imaging elements being operable to output an analog signal indicative of a respective image pixel;
   an addressing circuit coupled to the array of imaging elements, the addressing circuit being operable to cause the analog signals from the respective imaging elements to be sequentially output from array; and an analog-to-digital converter coupled to receive the analog signals from the array of imaging elements, the analog-to-digital converter including at least one amplifier comprising:
a first amplifier stage having an input terminal coupled to the input terminal of the amplifier, the first amplifier stage further having an output terminal;
a second amplifier stage having an input terminal coupled to the output terminal of the first amplifier stage, the second amplifier stage further having an output terminal couple to the output terminal of the amplifier;
a compensation capacitor coupled to provide negative feedback through the capacitor from the second amplifier stage to the first amplifier stage; and
a switch circuit coupled to one of the first and second amplifier stages to substantially attenuate the negative feedback coupled through the compensation capacitor for during an initial portion of an amplifying period of the at least one amplifier.

30. The imaging device of claim 29 wherein the switch circuit is coupled between complementary nodes of one of the first and second amplifier stages.

31. The imaging device of claim 30 wherein the switch circuit is coupled between complementary nodes of the first amplifier stage.

32. The imaging device of claim 29 wherein the second amplifier stage includes first and second complementary input terminals and first and second complementary output terminals, wherein the first amplifier stage each include first and second complementary input terminals and first and second complementary output terminals coupled to the first and second input terminals of the second amplifier stage, and wherein the amplifier further comprises:
a first compensating capacitor connected between the first output terminal of the second amplifier stage and a first node in the first amplifier stage on which a signal varies inversely with a signal output from the first output terminal; and
a second compensating capacitor connected between the second output terminal of the second amplifier stage and a second node in the first amplifier stage on which a signal varies inversely with a signal output from the first output terminal.

33. The imaging device of claim 29 wherein the switch circuit comprises a switch connected between the first and second nodes in the first amplifier stage.

34. The imaging device of claim 29 wherein the switch circuit comprises:
an electrically operated switch that is closed responsive to an activation signal applied to an input terminal of the electrically operated switch; and
a pulse generator having an input terminal coupled to receive a clock signal, and having an output terminal coupled to the input terminal of the electrically operated switch, the pulse generator being configured to generate the activation signal for a predetermined period responsive to each transition of the clock signal.

35. A method of enhancing the slew rate of an amplifier having first and second amplifier stages, the method comprising;
capacitively coupling the second amplifier stage to the amplifier stage to provide negative feedback from the second amplifier stage to the first amplifier stage; and
at least substantially reducing the negative feedback provided by the capacitive coupling during an initial portion of an amplifying period of the amplifier by attenuating the negative feedback provided by the capacitive coupling during the initial portion of the amplifying period.

36. The method of claim 35 wherein the act of at least substantially reducing the negative feedback provided by the capacitive coupling during an initial portion of an amplifying period of the amplifier comprises:
generating a clock signal having a transition occurring at the start of an amplifying period of the amplifier; and
at least substantially reducing the negative feedback provided by the capacitive coupling responsive to the a transition of the clock signals.

37. The method of claim 35 wherein the act of capacitively coupling the second amplifier stage to the first amplifier stage to provide negative feedback from the second amplifier stage to the first amplifier stage comprises capacitively coupling the second amplifier stage to the first amplifier stage through two capacitive coupling paths to provide negative feedback from the second amplifier stage to the first amplifier stage, and wherein the act of at least substantially reducing the negative feedback provided by the capacitive coupling during an initial portion of an amplifying period of the amplifier comprises substantially reducing the negative feedback coupled through both of the capacitive coupling paths during an initial portion of an amplifying period of the amplifier.

38. In a pipelined analog-to-digital converter in which an analog input signal is sequentially processed by a plurality of analog-to-digital converter stages each of which includes an amplifier having first and second amplifier stages, a method of enhancing the performance of the analog-to-digital converter, comprising;
capacitively coupling the second amplifier stage to the first amplifier stage to provide negative feedback; and
at least substantially reducing the negative feedback provided by the capacitive coupling during an initial portion of an amplifying period of the amplifier by attenuating the negative feedback provided by the capacitive coupling during the initial portion of the amplifying period.

39. The method of claim 38 wherein the act of at least substantially reducing the negative feedback provided by the capacitive coupling comprises substantially eliminating the negative feedback provided by the capacitive coupling.

40. The method of claim 38 wherein the act of at least substantially reducing the negative feedback provided by the capacitive coupling comprises capacitively coupling complementary nodes in the first amplifier stage to each other.

41. The method of claim 38 wherein the act of at least substantially reducing the negative feedback provided by the capacitive coupling during an initial portion of an amplifying period of the amplifier comprises:
generating a clock signal having a transition occurring at the start of an amplifying period of the amplifier; and
substantially reducing the negative feedback provided by the capacitive coupling responsive to the clock signal.

42. The method of claim 38 wherein the act of capacitively coupling the second amplifier stage to the first amplifier stage to provide negative feedback from the second amplifier stage to the first amplifier stage comprises capacitively coupling the second amplifier stage to the first amplifier stage through two capacitive coupling paths to provide negative feedback from the second amplifier stage to the first amplifier stage, and wherein the act of at least substantially reducing the negative feedback provided by the capacitive coupling during an initial portion of an amplifying period of the amplifier comprises substantially reducing the negative feedback coupled through both of the capacitive coupling paths during an initial portion of an amplifying period of the amplifier.

43. A method of enhancing the slew rate of an amplifier having first and second amplifier stages, the method comprising:
    capacitively coupling the second amplifier stage to the first amplifier stage to provide negative feedback from the second amplifier stage to the first amplifier stage; and
    at least substantially reducing the negative feedback provided by the capacitive coupling during an initial portion of an amplifying period of the amplifier by eliminating the negative feedback provided by the capacitive coupling during the initial portion of the amplifying period.

44. The method of claim 43 wherein the act of at least substantially reducing the negative feedback provided by the capacitive coupling during an initial portion of an amplifying period of the amplifier comprises:
    generating a clock signal having a transition occurring at the start of an amplifying period of the amplifier; and
    at least substantially reducing the negative feedback provided by the capacitive coupling responsive to the a transition of the a clock signals.

45. A method of enhancing the slew rate of an amplifier having first and second amplifier stages, the method comprising:
    capacitively coupling the second amplifier stage to the first amplifier stage to provide negative feedback from the second amplifier stage to the first amplifier stage; and
    at least substantially reducing the negative feedback provided by the capacitive coupling during an initial portion of an amplifying period of the amplifier by capacitively coupling complementary nodes in the first amplifier stage to each other during the initial portion of the amplifying period.

46. The method of claim 45 wherein the act of at least substantially reducing the negative feedback provided by the capacitive coupling during an initial portion of an amplifying period of the amplifier comprises:
    generating a clock signal having a transition occurring at the start of an amplifying period of the amplifier; and
    at least substantially reducing the negative feedback provided by the capacitive coupling responsive to the a transition of the a clock signals.

47. method of enhancing the slew rate of an amplifier having first and second amplifier stages, the method comprising:
    capacitively coupling the second amplifier stage to the first amplifier stage through two capacitive coupling paths to provide negative feedback from the second amplifier stage to the first amplifier stage; and
    at least substantially reducing the negative feedback provided by the capacitive coupling during an initial portion of an amplifying period of the amplifier by substantially reducing the negative feedback coupled through both of the capacitive coupling paths during an initial portion of an amplifying period of the amplifier.

48. In a pipelined analog-to-digital converter in which an analog input signal is sequentially processed by a plurality of analog-to-digital converter stages each of which includes an amplifier having first and second amplifier stages, a method of enhancing the performance of the analog-to-digital converter, comprising:
    capacitively coupling the second amplifier stage to the first amplifier stage to provide negative feedback; and
    at least substantially reducing the negative feedback provided by the capacitive coupling during an initial portion of an amplifying period of the amplifier by substantially eliminating the negative feedback provided by the capacitive coupling during the initial portion of the amplifying period.

49. The method of claim 48 wherein the act of at least substantially reducing the negative feedback provided by the capacitive coupling during an initial portion of an amplifying period of the amplifier comprises:
    generating a clock signal having a transition occurring at the start of an amplifying period of the amplifier; and
    substantially reducing the negative feedback provided by the capacitive coupling responsive to the clock signal.

50. In a pipelined analog-to-digital converter in which an analog input signal is sequentially processed by a plurality of analog-to-digital converter stages each of which includes an amplifier having first and second amplifier stages, a method of enhancing the performance of the analog-to-digital converter, comprising:
    capacitively coupling the second amplifier stage to the first amplifier stage to provide negative feedback; and
    at least substantially reducing the negative feedback provided by the capacitive coupling during an initial portion of an amplifying period of the amplifier by capacitively coupling complementary nodes in the first amplifier stage to each other during the initial portion of the amplifying period.

51. The method of claim 50 wherein the act of at least substantially reducing the negative feedback provided by the capacitive coupling during an initial portion of an amplifying period of the amplifier comprises:
    generating a clock signal having a transition occurring at the start of an amplifying period of the amplifier; and
    substantially reducing the negative feedback provided by the capacitive coupling responsive to the clock signal.

52. In a pipelined analog-to-digital converter in which an analog input signal is sequentially processed by a plurality of analog-to-digital converter stages each of which includes an amplifier having first and second amplifier stages, a method of enhancing the performance of the analog-to-digital converter, comprising:
    capacitively coupling the second amplifier stage to the first amplifier stage to provide negative feedback; and
    at least substantially reducing the negative feedback provided by the capacitive coupling during an initial portion of an amplifying period of the amplifier by generating a clock signal having a transition occurring at the start of an amplifying period of the amplifier, and substantially reducing the negative feedback provided by the capacitive coupling responsive to the clock signal.

53. In a pipelined analog-to-digital converter in which an analog input signal is sequentially processed by a plurality of analog-to-digital converter stages each of which includes an amplifier having first and second amplifier stages, a method of enhancing the performance of the analog-to-digital converter, comprising:
    capacitively coupling the second amplifier stage to the first amplifier stage through two capacitive coupling paths to provide negative feedback; and
    at least substantially reducing the negative feedback provided by the capacitive coupling during an initial portion of an amplifying period of the amplifier by substantially reducing the negative feedback coupled through both of the capacitive coupling paths during an initial portion of an amplifying period of the amplifier.

* * * * *

UNITED STATES PATENT AND TRADEMARK OFFICE
CERTIFICATE OF CORRECTION

| | |
|---|---|
| PATENT NO. | : 7,564,397 B2 |
| APPLICATION NO. | : 11/786338 |
| DATED | : July 21, 2009 |
| INVENTOR(S) | : Taehee Cho |

It is certified that error appears in the above-identified patent and that said Letters Patent is hereby corrected as shown below:

In column 8, lines 16-17, in Claim 9, delete "transistors" and insert -- transistors, --, therefor.

In column 8, lines 44-45, in Claim 12, delete "output terminal, an analog input terminal," and insert -- input terminal, an analog output terminal, --, therefor.

In column 10, line 29, in Claim 18, delete "operation" and insert -- operational --, therefor.

In column 13, line 11, in Claim 29, delete "couple" and insert -- coupled --, therefor.

In column 13, lines 60-61, in Claim 35, delete "comprising;" and insert -- comprising: --, therefor.

In column 13, line 63, in Claim 35, delete "amplifier" and insert -- first amplifier --, therefor.

In column 14, line 10, in Claim 36, delete "the a" and insert -- the --, therefor.

In column 14, line 30, in Claim 38, delete "comprising;" and insert -- comprising: --, therefor.

In column 15, line 19, in Claim 44, delete "the a" and insert -- the --, therefor.

In column 15, line 20, in Claim 44, delete "the a" and insert -- the --, therefor.

In column 15, line 40, in Claim 46, delete "the a" and insert -- the --, therefor.

In column 15, line 41, in Claim 46, delete "the a" and insert -- the --, therefor.

UNITED STATES PATENT AND TRADEMARK OFFICE
CERTIFICATE OF CORRECTION

PATENT NO. : 7,564,397 B2
APPLICATION NO. : 11/786338
DATED : July 21, 2009
INVENTOR(S) : Taehee Cho It is certified that error appears in the above-identified patent and that said Letters Patent is hereby corrected as shown below:

In column 15, line 42, in Claim 47, delete "method" and insert -- A method --, therefor.

Signed and Sealed this

Eighth Day of September, 2009

David J. Kappos
*Director of the United States Patent and Trademark Office*